United States Patent [19]
Jones, Jr.

[11] Patent Number: 5,379,261
[45] Date of Patent: Jan. 3, 1995

[54] METHOD AND CIRCUIT FOR IMPROVED TIMING AND NOISE MARGIN IN A DRAM

[75] Inventor: Oscar F. Jones, Jr., Colorado Springs, Colo.

[73] Assignees: United Memories, Inc., Colorado Springs, Colo.; Nippon Steel Semiconductor Corporation, Chiba, Japan

[21] Appl. No.: 37,288

[22] Filed: Mar. 26, 1993

[51] Int. Cl.$^6$ .................. G11C 8/00; G11C 7/00
[52] U.S. Cl. .................. 365/230.01; 365/230.08; 365/194
[58] Field of Search .......... 365/230.08, 230.01, 365/206, 194, 233, 238.05

[56] References Cited

U.S. PATENT DOCUMENTS

| | | | |
|---|---|---|---|
| 4,476,548 | 10/1984 | Matsumoto | 365/230.08 |
| 4,984,216 | 1/1991 | Toda | 365/230.08 |
| 5,077,693 | 12/1991 | Hardee | 365/230.08 |
| 5,079,748 | 1/1992 | Miyatake | 365/233 |
| 5,280,601 | 1/1994 | Desai | 365/238.05 |

OTHER PUBLICATIONS

Microelectronic Circuits, 2nd Edition A. S. Sedra, K. C. Smith, HRW, Inc., New York, 1987.

Primary Examiner—Anita Pellman Gross
Assistant Examiner—Tiep H. Nguyen
Attorney, Agent, or Firm—Edward D. Manzo; John J. King

[57] ABSTRACT

A method and circuit improves the timing of a static column mode device by extending the valid write time to be equal to the write time in a fast page mode device. In particular, the circuit extends the global write enable signal and maintains the address in the address latch to increase the valid write time. Also, the circuit of the present invention improves the noise margin in the static column mode device by decoupling the write enable and column address strobe signals after they are initially received to ignore any noise in those signals. A timer is used.

23 Claims, 3 Drawing Sheets

INTERNAL WRITE CYCLE TIMING
(FPM VERSUS SCM TIMING)

METHOD AND CIRCUIT FOR IMPROVED TIMING AND NOISE MARGIN IN A DRAM

FIELD OF THE INVENTION

This invention relates to a method and circuit for improving the timing and noise margin in a dynamic random access memory and more particularly to a circuit for extending the valid write time for a dynamic random access memory operating in the static column mode.

DESCRIPTION OF THE PRIOR ART

Dynamic random access memories (DRAMs) can be categorized into one of two groups depending upon the operating mode of the device. One group includes the static column mode devices and the other includes the fast page mode devices. While the fast page mode devices are more common, static column mode devices are still used in large numbers. One primary difference between the devices resides in the latching of address information. The difference in latching address information may lead to certain advantages and disadvantages in the respective devices. For example, a static column mode device may have a slightly faster access time than a fast page mode device, but generally will have a slower cycle time. Certain control signals are required to access (i.e. read data from or write data to) a DRAM. In particular, the primary control signals (shown in FIG. 1) required to access a DRAM are the row address strobe /RAS, column address strobe /CAS (also commonly referred to as a column enable signal /CE), and the write enable signal /WE. (It will be understood that the forward slash placed before a given signal will indicate an inverted state of the given signal. Typically, the inverted state of a signal is indicated when an input to a circuit requires an active low signal, or the circuit generates an active low output.)

An active low /RAS indicates that the proper row address has been provided. Because static column mode and fast page mode devices are "page mode" devices, additional data can be read from the memory or written to the memory without certain address information having to be repeated. For example, the row address may be maintained with a low /RAS signal while the column address may be changed. An active low /CAS indicates that the proper column address has been provided. Finally, an active low /WE indicates that a write function is to be performed and that data is to be written to the memory. These signals are established by practice in the industry and, therefore, the certain pulse widths of the signals have become de facto standards.

As defined by de facto standards established in the industry, an active low /WE signal is shorter than an active low /CAS signal. For example, while the duration of the active low /CAS pulse (designated as $t_{CAS}$ in FIG. 1) in a particular device may be 15 nanoseconds, the duration of the active low /WE pulse (designated as $t_{WE}$ in FIG. 1) may be approximately two thirds of the duration of /CAS, or about 10 nanoseconds. As will be explained in detail infra, this difference in duration affects the write time in a static column mode device. It will be understood that a 15 nanosecond /CAS pulse and a 10 nanosecond /WE are used by way of example, and that /CAS and /WE of a device having a different speed may have different durations.

Because /WE remains high when /CAS is low in an address multiplexed DRAM, the industry-established difference between $t_{CAS}$ and $t_{WE}$ does not affect reading data from a DRAM, regardless of whether it is a fast page mode device or a static column mode device. The method and circuit of the present invention will affect the operation of the DRAM when writing. Accordingly, for purposes of the present invention, only writing data to the DRAM will be described in detail.

To effectively write data to a DRAM, the following must be provided: (i) valid data, (ii) a valid address to store the data, and (iii) an active internal write enable signal, called global write enable ("CGWE"). (A global write enable signal may also be called a write strobe signal or referred to by some other name, but generally concerns to a signal which indicates that all required signals for a write cycle have been received). However, the control signals required to write data to a DRAM are different for a static column mode device and a fast page mode device. The industry-established control signals required to write data limit the valid write time in a static column mode device. In particular, the control signals which latch the valid address and which determine the duration of GWE differ between a fast page mode device and a static column mode device. As a result of these differences, a conventional static column mode device must be down-graded in speed.

The primary differences when writing data to a fast page mode device versus a static column mode device will be described with reference to FIG. 1. It will be noted that the representation of signals as active high or active low signals is not intended as a limitation. Rather, active high or active low signals have been selected merely by way of example. When writing data to any DRAM, /RAS must be low, as shown at time $t_0$. Unless otherwise noted, it will be assumed that /RAS is low. When writing data to a fast page mode device, data is latched on the latter of /CAS or /WE going low. As shown at time $t_1$, both /CAS and /WE go low to latch the data. The data remains latched until either /RAS or /CAS goes high, as described in reference to the data latch circuit disclosed in U.S. application Ser. No. 08/037,818, filed Mar. 26, 1993 (attorney docket no. UM-120), the entire application of which is incorporated by reference.

The valid address is also latched in a fast page mode device on the latter of /CAS or /WE going low. The address remains latched, and is released on the following edge of /CAS at time $t_3$. That is, the address remains latched as long as /CAS remains low (during $t_{CAS}$), regardless of any change in the state of /WE. The latch will release the address when /CAS goes high. Also, the global write enable signal in a fast page mode device is generally independent of /WE and will remain valid for as long /CAS remains low. Accordingly, GWE in a fast page mode device will extend for a period $t_{GWE(FPM)}$ as shown in FIG. 1.

In a static column mode device, data is latched in the same way as in a fast page mode device. However, the address is latched differently. The address is latched on the latter edge of /CAS or /WE going low, as in the fast page mode. Unlike the address latch of a fast page mode device, the address latch of a static column mode device releases the address when either /CAS or /WE goes high. Because the active low /WE pulse is shorter than the active low /CAS pulse (as established by de facto industry standards), the address is valid for a shorter period of time in a static column mode device than in a fast page mode device. Also, a GWE signal is generated in a static column mode device whenever /RAS, /CAS and /WE are all low, indicating that all required signals to perform a write have been provided. Because the /WE signal is shorter in a static column mode device, the required GWE signal remains active for a shorter period (designated as $t_{GWE(SCM)}$ in FIG. 1) than in a fast page mode device. Unless $t_{GWE(SCM)}$ is extended (as shown by the dashed line in FIG. 1), the device may have to be down-graded in speed.

As will be described in detail in the description of the preferred embodiment, a circuit according to the present invention can be included in any DRAM and activated to extend the write enable time when the DRAM is configured as a static column device.

Therefore, an object of the present invention is to improve the timing and noise margin in a static column mode device.

Another object of the present invention is to extend internally GWE so that the valid write time of a static column mode device is substantially the same as the valid write time of a fast page mode device. That is, an object of this invention is to make the write timing margins substantially identical for both fast page mode devices and static column mode devices.

A further object of the present invention is to maintain the address in the address latch of the DRAM for an extended period to insure proper writing of data in a static column mode device.

SUMMARY OF THE INVENTION

The method and circuit aspects of the present invention concern improving the timing and noise margin in a DRAM. In particular, according to one aspect of the invention the internally-generated global write enable signal is extended in a DRAM operating as a static column mode device. Preferably, the address is maintained in the address latch to provide a valid address for an extended time. Accordingly, the method and circuit offered by the present invention improve the timing of a static column mode device and prevent the static column mode device from being down-graded in speed compared to a comparable fast page mode device. The circuit of the present invention also improves the noise margin in the static column mode device by decoupling the /WE and /CAS signals after they are initially received to ignore any noise on /WE and /CAS.

BRIEF DESCRIPTION OF THE DRAWINGS

The present invention is described with reference to the following Figures, wherein.

DESCRIPTION OF THE PREFERRED EMBODIMENTS

Figure 1:
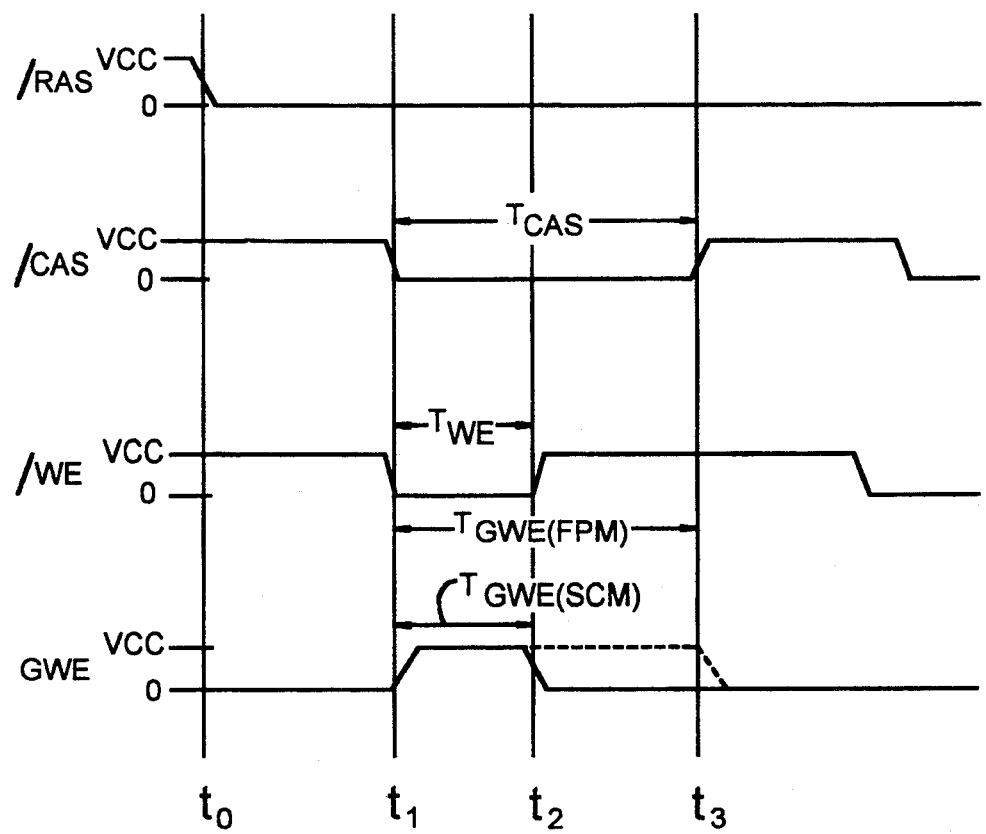
FIG. 1 is a timing diagram of control signals used in a DRAM.
Figure 2:
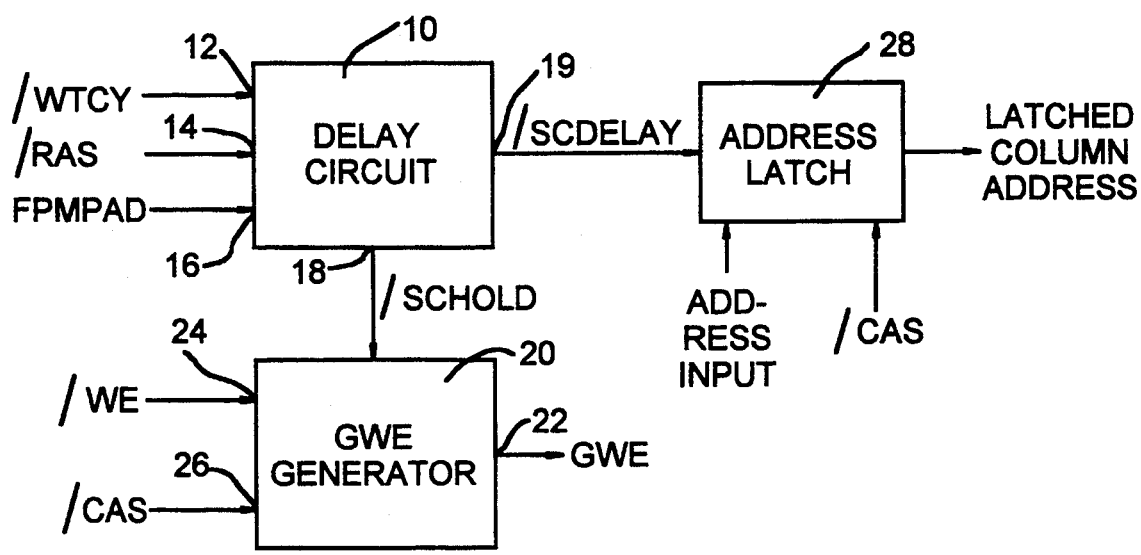
FIG. 2 is a block diagram of a circuit embodying the present invention for improving the timing and noise margin in a DRAM.

Turning to FIG. 2, a block diagram of the circuit of the present invention is shown. A delay circuit 10 receives as inputs a write cycle signal /WTCY, a row address strobe signal /RAS, and a fast page mode signal FPMPAD. An active low /WTCY is received at an input 12 when both /CAS and /WE signals in a DRAM have gone low to indicate that an active write cycle has begun. In particular, a low /WTCY signal is input to delay circuit 10 whenever /CAS and /WE go low. As is well known in the art, some devices may receive two /CAS signals or two /WE signals. For example, a "by-16" device may receive two /CAS signals and one /WE signal, or one /CAS signal and two /WE signals. Therefore, the method and circuit of the present invention can be employed in any DRAM where a low /WTCY signal will be generated when at least one /CAS and at least one /WE go low.

A second input 14 coupled to receive /RAS is used to reset the circuit. Because both static column mode devices and fast page mode devices are "page mode" devices (i.e. the row address is maintained while the column address is changed), /RAS is maintained low. As will be described in detail infra, whenever /RAS goes high, the circuit will be reset.

Finally, FPMPAD is received at an input 16. FPMPAD indicates whether the device is a fast page mode device or a static column mode device. Certain output signals are not required in a fast page mode device. As will be explained infra, FPMPAD is used selectively in the circuit to generate inactive outputs. The state of FPMPAD can be established by a metal option, a wire bond option, or programmably at an input terminal.

Figure 4:
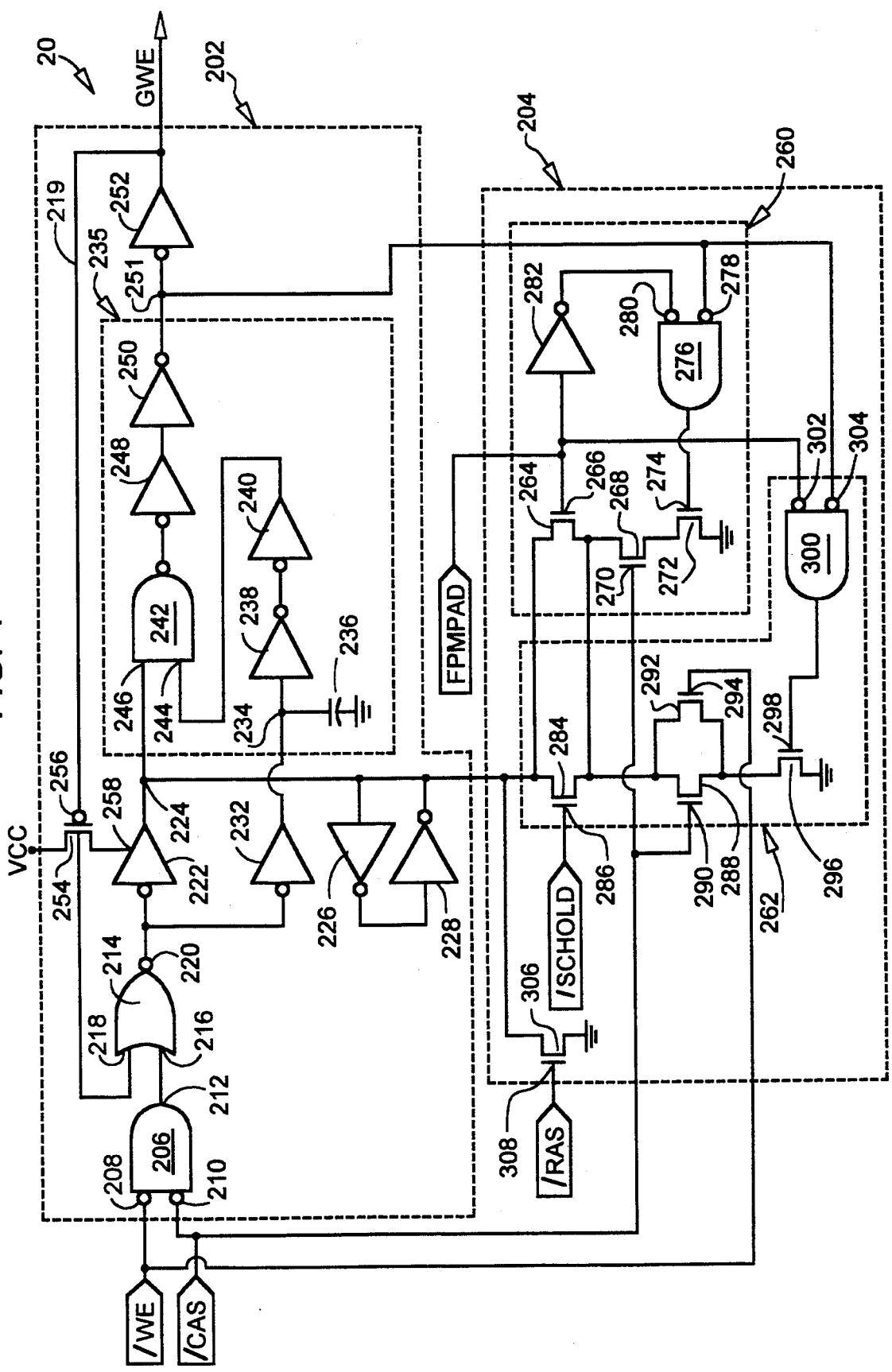
FIG. 4 is a logic circuit diagram of the preferred global write enable generator circuit shown in the logic diagram of FIG. 2 for internally generating an extended global write enable signal.

Delay circuit 10 outputs a "static column hold" signal /SCHOLD at a first output 18 and a "static column delay" signal /SCDELAY at a second output 19. /SCHOLD is coupled to a global write enable generator circuit 20 (described in detail in reference to FIG. 4). An active (low) /SCHOLD signal generally enables the global write enable circuit 20 to generate an "extended" global write enable signal GWE at an output 22. In particular, an active /SCHOLD signal causes the global write enable generator circuit to "ignore" /WE and to maintain a valid GWE output, thereby to extend the valid write time of the memory.

The second output /SCDELAY of delay circuit 10 holds an address in the address register or latch 28. It will be recalled that it is necessary to extend the internal global write enable signal and maintain the address in the address register to increase the valid write time of a static column mode device.

The Delay Circuit

Figure 3:
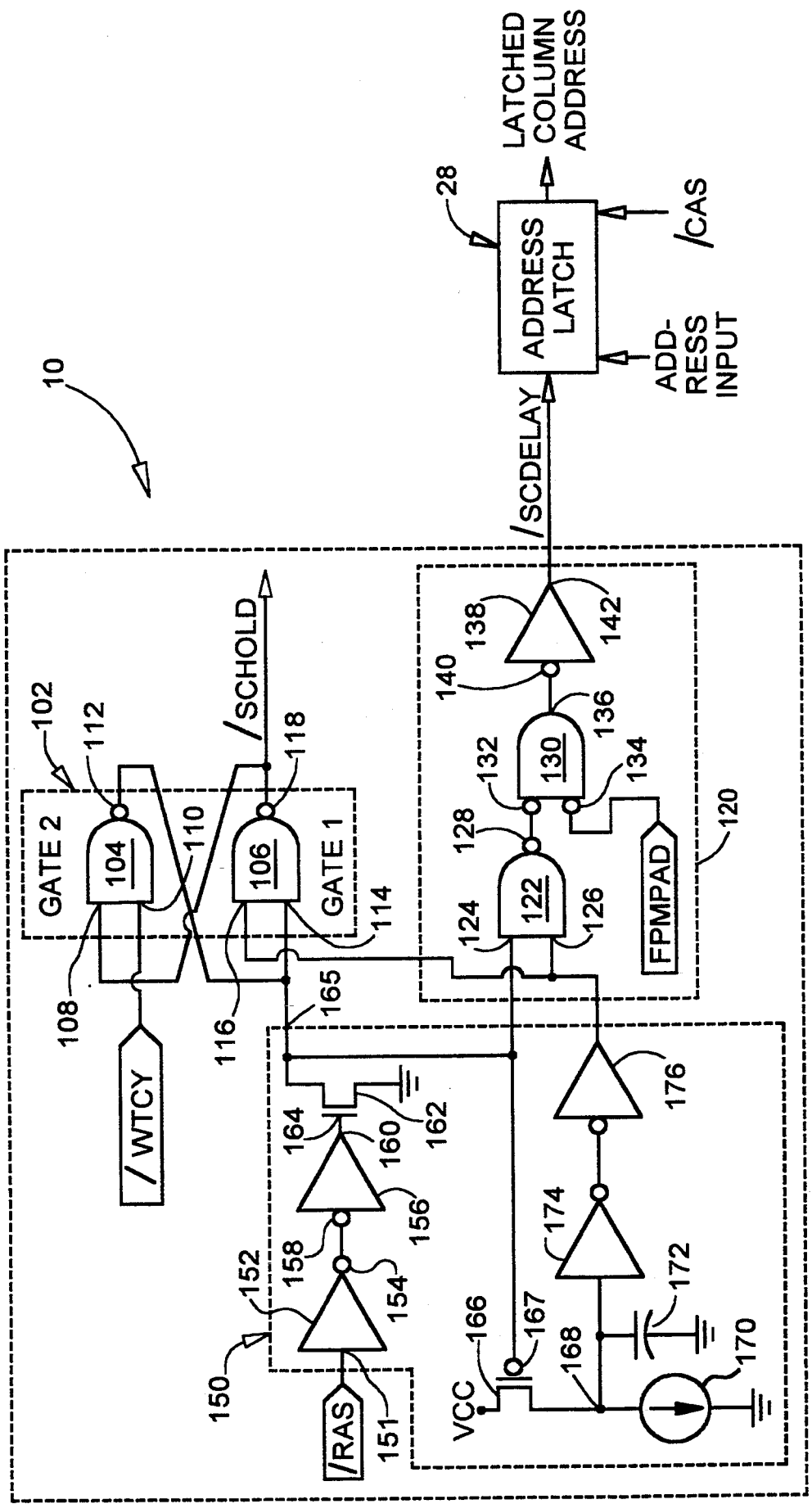
FIG. 3 is a logic circuit diagram of the preferred delay circuit shown in FIG. 2.

Turning now to FIG. 3, a logic diagram of the preferred delay circuit 10 is shown. Delay circuit 10 includes a latch 102 comprising NAND gates 104 and 106. NAND gate 104 includes inputs 108 and 110 and an output 112. NAND gate 106 includes inputs 114 and 116 and an output 118. The NAND gates are cross-coupled to generate and to latch /SCHOLD.

In the initial state, /SCHOLD and /WTCY (coupled to the inputs of NAND gate 104) are high. When /WTCY goes low, output 112 of NAND gate 104 goes high. Output 112 is coupled to input 114 of NAND gate 106. Because the initial state of input 116 of NAND gate 106 is high, the output of NAND gate 106 goes low to generate a low /SCHOLD signal. The /SCHOLD signal is latched for a set period established by the circuit or until the state of /RAS changes to reset the circuit, as described in detail infra. As will be discussed in detail in reference to FIG. 4, the global write enable generator circuit receives /SCHOLD to ignore /WE and /CAS for a given period and to generate an extended GWE signal.

Output 112 of NAND gate 104 is also coupled to an address control circuit 120 to generate /SCDELAY. As described supra, a valid address (along with valid data and an active GWE signal) is required to write data to the intended address in the DRAM. That is, extending GWE would be futile if a valid address were not also maintained. Accordingly, delay circuit 10 also generates the signal /SCDELAY to maintain the valid address. /SCDELAY is coupled to an input of the address latch 28 in the DRAM to maintain the valid address.

In particular, the high output 112 of NAND gate 104 is coupled to a NAND gate 122 at an input 124. Because the initial state of an input 126 is high, an output 128 of NAND gate 122 is low. Output 128 is coupled to a NOR gate 130 at an input 132. FPMPAD is also coupled to NOR gate 130 at an input 134. Whenever the FPMPAD signal is high, indicating that the device is a fast page mode device, output 136 is low. Output 136 is coupled to an inverter 138 which generates a high (inactive) /SCDELAY signal at output 142. If the device is a fast page mode device (i.e. FPMPAD is high), /SCDELAY is not necessary to maintain the valid address in address latch 28.

When FPMPAD is low, indicating that the device is a static column device, input 134 is low. Therefore, NOR gate 130 acts as an inverter of the signal at input 132. When output 112 of NAND gate 104 goes high during a write cycle, both inputs to NAND gate 122 are high. Accordingly, the output of NAND gate 122 goes low. This low signal is inverted by NOR gate 130 and again inverted by inverter 138 to generate a low (active) /SCDELAY signal at output 142 (which corresponds to output 19 of circuit 10 in FIG. 2). Therefore, the address is maintained in address latch 28 by the low /SCDELAY signal, while GWE is maintained by the low /SCHOLD.

The active /SCHOLD and /SCDELAY signals are maintained until they are reset by a reset circuit 150. Reset circuit 150 receives /RAS at an input 151 of an inverter 152. An output 154 of inverter 152 is coupled to another inverter 156 at an input 158. An output 160 of inverter 156 is coupled to an N-channel transistor 162 at its control electrode 164. When /RAS goes high, indicating the end of a write cycle, /RAS is inverted by inverters 152 and 156 to generate a high signal at the control electrode 164. This high signal turns on transistor 162 to pull a node 165 low, since one side of the source-drain path of transistor 162 is grounded, as shown in FIG. 3.

Node 165 is coupled to input 114 of NAND gate 106 to pull the input to its initial low state. It will be recalled that input 114 was pulled high by output 112 (of NAND gate 104) after /WTCY had gone low during the active write cycle. Also, because the low signal at node 165 is coupled to input 114 of NAND gate 106, output 118 will go high. Accordingly, /SCHOLD is reset to its initial high state. Input 108 of NAND gate 104 (coupled to receive /SCHOLD) is also reset to its initial state (so that the proper signal at output 112 will be generated when another low /WTCY signal is generated at a later time, indicating another write cycle has begun). Because a low /WTCY signal is generated when a write cycle is detected, input 110 (/WTCY) is automatically reset at the end of the write cycle when /RAS goes high.

Also, the low signal at node 165 is coupled to input 124 of NAND gate 122 to reset /SCDELAY. Because at least one input of NAND gate 122 is low, a high signal is generated at output 128. Assuming the device is a static column mode device (i.e. FPMPAD is low), this high output is inverted by NOR gate 130 to generate a low output at 136. The low output is inverted by inverter 138 to generate a high /SCDELAY signal. Accordingly, /SCDELAY is also reset to its initial value.

Finally, it will be noted that input 116 of NAND gate 106 and input 126 of NAND gate 122 will also be reset to their initial values to ensure that the proper /SCHOLD and /SCDELAY will be generated upon receiving an active /WTCY pulse at a later time. In particular, a low signal at node 165 will turn on a p-channel transistor 166. Accordingly, a path will be provided to charge a node 168 to VCC by way of transistor 166. The high signal at node 168 is coupled to generate a high signal at inputs 116 and 126 by way of a first inverter 174 and a second inverter 176. Accordingly, outputs /SCHOLD and /SCDELAY and the inputs to latch 102 and address control circuit 120 can be reset by /RAS.

If circuit 10 is not reset by /RAS, a separate time out feature of reset circuit 150 will reset /SCHOLD and /SCDELAY, as well as the inputs to latch 102 and address control circuit 120. When /WTCY goes low to generate a high signal at output 112, this high output turns off transistor 166. Accordingly, node 168 which is coupled to a capacitor 172 is allowed to discharge by way of current source 170. The period required to discharge capacitor 172 is determined by the size of the capacitor and the amount of current flowing through current source 170. The size of the capacitor and the current flowing through current source 170 depends on the speed of the device and, therefore, the desired minimum duration of GWE, /SCHOLD and /SCDELAY.

After capacitor 172 has discharged and node 168 has gone low, the low signal is passed through inverters 174 and 176 to generate a low signal at inputs 116 and 126. The low signal at input 116 of NAND gate 106 will reset /SCHOLD (at output 118 of NAND gate 106) to its initial high state. Also, the low signal at input 126 will reset /SCDELAY. In particular, the low signal at input 126 of NAND gate 122 will generate a high signal at output 128. Assuming the DRAM is a static column mode device and FPMPAD is low, NOR gate 130 will act as an inverter of output 128. Therefore, the high signal at output 128 will be inverted by NOR gate 130 and inverter 138 to generate a high /SCDELAY.

Also, after the time-out period, the inputs to latch 102 and address control circuit 120 will be reset if /WTCY had gone high (or when /WTCY goes high) to ensure that active /SCHOLD and /SCDELAY signals will be generated on the next active /WTCY. In particular, after the time out period, /SCHOLD will go high, as described infra. If /WTCY had already gone high (or when /WTCY goes high), output 112 will go low to reset inputs 114 and 124 to their initial low state. Also, the low signal at output 112 will turn on transistor 166 to charge node 168. As a result, the high signal at node 168 will be inverted by inverters 174 and 176 to generate a high signal at inputs 116 and 126. Accordingly, after the time-out delay, /SCHOLD and /SCDELAY are reset, while the inputs to latch 102 and address control circuit 120 are reset when /WTCY is high.

In summary, delay circuit 10 of FIG. 3 generates a /SCHOLD signal which is coupled to a global write enable generator circuit (shown in FIG. 4). When an active /SCHOLD signal is generated, global write enable generator circuit 20 will generate an extended GWE signal. Delay circuit 10 also outputs a /SCDELAY signal which maintains the address in the address latch 28 for a static column mode DRAM for an extended time period during a write cycle. Although the logic diagram of the preferred delay circuit is shown in FIG. 3, it will be understood other circuits which generate a first delay signal to maintain the address in an address latch and a second delay signal to extend the GWE signal would be considered within the scope of the present invention.

The Global Write Enable Generator Circuit

Turning now to FIG. 4, a logic diagram of the preferred global write enable (GWE) generator circuit 20 is shown. Circuit 20 includes a GWE generator 202 which generates the GWE signal and a static column hold circuit 204 which determines the duration of GWE.

GWE generator 202 receives inputs /WE and /CAS and generates an output GWE. In particular, a NOR gate 206 receives /WE at an input 208 and /CAS at an input 210. When both /WE and /CAS are low (indicating an active write cycle), the output 212 of NOR gate 206 is high. Output 212 is coupled to NOR gate 214 at an input 216. A second input 218 of NOR gate 214 is coupled to GWE by a feedback path 219. When a valid high GWE signal is generated, the high signal at input 218 will allow GWE generator 202 to ignore changes in /WE and /CAS. That is, the high input to NOR gate 214 will insure that the output of NOR gate 214 is low (regardless of the state of /WE or /CAS). It will be recalled that this is particularly important in the static column mode device where the shorter duration of /WE will reset GWE prematurely.

Because a false /WE or /CAS signal may appear at input 208 or 210, deglitching circuitry is included to insure that valid /WE and /CAS signals have been received to generate a valid GWE signal. In particular, an output 220 of NOR gate 214 is coupled to an inverter 222. The output of inverter 222 is coupled to generate a signal at a first node 224. Node 224 is coupled to a pair of inverters 226 and 228 which latch the signal at node 224. The output of NAND gate 214 is also coupled to the input of an inverter 232. The output of inverter 232 generates a signal at a second node 234. The signals generated at the first and second nodes 224 and 234 are input to a deglitching circuit 235.

Deglitching circuit 235 generally compares the voltages at node 224 and 234 to determine whether valid /WE and /CAS signals have been received. In particular, node 234 is coupled to a delay capacitor 236. A delay is provided as capacitor 236 charges. The value for the capacitor and, therefore, the delay set by the capacitor, is determined by the amount of deglitching desired. As stated supra, the method and circuit of the present invention can be incorporated in DRAMs which operate at different speeds.

When the capacitor charges, the high signal at node 234 is input to series-connected inverters 238 and 240. The output of inverter 240 is coupled to NAND gate 242 at an input 244. Also, node 224 is coupled to a second input 246 of gate 242. Because these inputs represent the state of output 220 of NOR gate 214 at different times, these inputs will determine whether /WE and /CAS are valid signals. If both inputs 244 and 246 are both high, indicating valid active /WE and /CAS inputs, the output of NAND gate 242 is low. The output of NAND gate 242 is passed through series-connected inverters 248 and 250 to generate an inverted GWE signal at a node 251. This inverted GWE signal is input to an inverter 252 to generate a high (active) GWE signal.

Feedback loop 219 also couples GWE to a control electrode 256 of a P-channel transistor 254. Transistor 254 is coupled to an enable terminal 258 of inverter 222. When GWE is low, transistor 256 is turned on to enable inverter 222 to receive the output of NOR gate 214. However, when a valid high GWE signal is generated, transistor 254 is turned off, thereby disabling inverter 222. This decouples node 224 from NOR gate 214 to ignore /WE or /CAS. Although node 224 is decoupled, the state at the node 224 is maintained by the latch formed by inverters 226 and 228. It will be noted that decoupling /WE and /CAS when a valid GWE signal is generated will improve the noise margin of the DRAM. In particular, any noise on inputs /WE or /CAS will be blocked after a valid GWE signal has been generated.

Having described the generation of a GWE signal by GWE generator 202, static column hold circuit 204 which controls the duration of GWE will now be described. Static column hold circuit 204 ensures that GWE is extended in a static column mode device. In particular, static column hold circuit 204 includes a fast page mode circuit 260 and a static column mode circuit 262. Both circuits are coupled to node 224 and are responsive to /CAS and /WE to alter the voltage at node 224 (and therefore GWE) when appropriate. In particular, each circuit provides a path from node 224 to ground. When the transistors in the respective paths are turned on, node 224 will be pulled to ground to reset GWE by way of NAND gate 242 and inverters 248, 250 and 252. The operation of the circuit employed in a fast page mode device will be described first, followed by the operation of the circuit employed in a static column mode device.

Generally, a path may be provided from node 224 to ground in the fast page mode circuit 260 by way of a series of three transistors, including a transistor 264 having a control electrode 266, a transistor 268 having a control electrode 270, and a transistor 272 having a control electrode 274. Another terminal or electrode of transistor 272 is coupled to ground. When transistors 264, 268 and 272 are turned on, under the appropriate conditions, node 224 will be pulled to ground to reset GWE.

In particular, FRMPAD is coupled to control electrode 266 of transistor 264. When the device is a fast page mode device, FPMPAD is high, and thus transistor 264 is turned on to couple node 224 to FPMPAD circuit 260. Also, transistor 268 is coupled to receive /CAS at its control electrode 270. As suggested supra, a high /CAS signal will reset the address latch in a fast page mode device. Finally, a transistor 272 completes the series path from node 224 to ground through fast page mode circuit 260. Transistor 272 is turned on when in the fast page mode and when GWE is high. Control electrode 274 of transistor 272 is coupled to both FPMPAD and GWE by way of a NOR gate 276. In particular, NOR gate 276 receives an inverted GWE signal (node 251) at an input 278. Also, NOR gate 276 receives an inverted FPMPAD signal at an input 280 by way of an inverter 282. Accordingly, when the device is a fast page mode device (as indicated by a high FPMPAD signal) and GWE is high (indicating an active write cycle), the output of NOR gate 276 is high, which turns on transistor 274. Therefore, when the fast page mode device is in an active write cycle, two transistors (264, 272) in the series will be on. Accordingly, GWE can be reset by /CAS going high.

In contrast, when the device is set for the static column mode, FPMPAD is low, turning off transistor 264 and decoupling fast page mode circuit 260 from node 224. However, a separate path from node 224 to ground is provided through circuit 262 when the device is a static column mode device. In particular, a path is provided by an arrangement of transistors, including a transistor 284 having a control electrode 286, a transistor 288 having a control electrode 290, a transistor 292 having a control electrode 294, and a transistor 296 having a control electrode 298.

Control electrode 286 of transistor 284 is coupled to receive /SCHOLD from the delay circuit 10 of FIG. 3. When /SCHOLD is low, indicating an active write cycle, transistor 284 is turned off. Also, parallel pair of transistors 288 and 292 are coupled in series with transistor 284. The control electrodes of transistors 288 and 292 are coupled to receive /CAS and /WE, respectively. Accordingly, when either /CAS or /WE goes high, node 224 may be coupled to ground (if transistor 284 and transistor 296 are also conductive). Transistor 296 is coupled in series with transistors 284 and the pair of transistors 288 and 292 between node 224 and ground. Control electrode 298 is coupled to the output of a NAND gate 300 having inputs 302 and 304 of coupled to receive FPMPAD and the inverted GWE signal at node 251. In the static column mode during an active write cycle, both FPMPAD and node 251 are low. Therefore, the output of NAND gate 300 is high, turning on transistor 296.

The significance of /SCHOLD generated by the delay circuit 10 FIGS. 2 and 3 is now apparent. In particular, when a low /SCHOLD signal is generated to indicate an active write cycle, transistor 284 is turned off. Thus, in static column mode, node 224 finds no path to ground via circuit 262 until signal /SCHOLD becomes high. As set forth supra, this goes high after a time-out or /RAS changes. With node 224 held high, GWE generator circuit 202 will ignore /CAS and /WE. As a result, during the time-out delay, node 224 (and therefore GWE) will remain high for an extended period of time established by the time-out delay. When /SCHOLD goes high (i.e. when /SCHOLD is reset by delay circuit 10), transistor 284 is turned on. Therefore, if GWE is high, node 224 will be pulled to ground whenever either /CAS or /WE goes high. A write cycle is terminated whenever /RAS goes high.

Finally, node 224 is coupled to a transistor 306. A control electrode 308 of transistor 306 receives /RAS to reset node 224 (and GWE) whenever /RAS goes high. As stated supra, a write cycle is automatically terminated when /RAS goes high.

To recapitulate, circuit 20 is configured to receive /WE and /CAS, to generate a global write enable signal GWE, and to ensure that GWE is valid. Also, circuit 20 includes a fast page mode circuit 260 which is engaged in a fast page mode device to reset GWE when /CAS goes high. Finally, circuit 20 includes a static column hold circuit 262 to receive a delay signal /SCHOLD. This signal is coupled to the control electrode of a transistor which prevents /WE or /CAS from resetting GWE. Accordingly, GWE is extended in a static column mode device. Because /SCDELAY generated by circuit 10 (FIG. 3) maintains the address in the address latch, the static column mode part does not need to be down-graded, but can operate at the same speed as a comparable fast page mode device.

While this invention has been described with reference to an illustrative embodiment, it will be understood that this description is not intended to be construed in a limiting sense, but is intended to include any substitutes within the scope of the invention. Various modifications of the illustrative embodiment, as well as other embodiments, will become apparent to those skilled in the art upon reference to this description. The invention is intended to be set forth in the following claims.

I claim:

1. A circuit for extending a valid write time in a DRAM when used in a static column mode so that the valid write time is longer than an active state of an external write enable signal applied to the DRAM, the circuit cooperating with an address latch for latching address information and comprising:

a first circuit coupled to receive, as at least one input, the external write enable control signal, said first circuit generating an internal write enable signal for writing data into the DRAM and maintaining said internal write enable signal for a predetermined period; and a second circuit coupled to the first circuit and coupled to receive an active write signal and a mode-indicating signal indicative of whether the DRAM is to operate in a fast page mode or the static column mode, the second circuit being configured so that when said mode-indicating signal indicates that the DRAM is in the static column mode, the second circuit is effective to generate an address delay signal in response to said active write signal, said address delay signal being coupled to an input of the address latch for controlling the address latch to maintain therein address information for use in the writing during said predetermined period despite a change in the external write enable signal from an active state to an inactive state, so that the address information continues to remain latched in the address latch even after said state change of the external write enable signal for a duration corresponding to said predetermined period.

2. The circuit of claim 1 wherein said first circuit receives said external write enable signal at a first input, and wherein the circuit further includes:

a second input for receiving a column address strobe;
a third input for receiving a row address strobe; and
a first output providing said internal write enable signal.

3. The circuit of claim 2 wherein said first circuit is configured to combine logically the external write enable signal with the column address strobe in generating the internal write enable signal, and wherein the first circuit is configured so that when the DRAM is in the static column mode, after the first circuit generates the internal write enable signal in an active state, it decouples said external write enable signal and said column address strobe for said predetermined period of time after said active write signal is received by said second circuit so that a change from an active state to an inactive state in the external write enable signal will not cause a corresponding change of the internal write enable signal to an inactive state.

4. The circuit of claim 1 wherein said second circuit further includes:
a first input for receiving said active write signal; and
a second input for receiving said row address strobe, wherein said second circuit causes said address delay signal to be terminated in response to a state change in the row address strobe.

5. The circuit of claim 4 wherein said second circuit further includes a timing circuit to establish said predetermined period.

6. The circuit of claim 5 wherein said timing circuit includes a capacitor and wherein said predetermined period is determined by a discharge of said capacitor.

7. A circuit for extending a valid write time in a DRAM configured as a static column mode device so that the valid write time is longer than an active state of an external write enable signal (/WE) applied to the DRAM, the circuit cooperating with an address latch for latching address information and comprising:
a first input coupled to receive the external write enable signal, the circuit being responsively coupled thereto to change a state of an internal write enable signal from an inactive state to an active state;
a second input coupled to receive an active write cycle signal (WTCY) indicating an active write cycle, wherein said circuit is responsive to the active state of said internal write enable signal (GWE) to prevent said external write enable signal (/WE) during a predetermined period of time from changing the internal write enable signal (GWE) to the inactive state;
a first output for providing internal write enable signal, wherein said internal write enable signal is active for said predetermined period of time; and
a second output for providing an address latch signal, said second output being coupled to the address latch for maintaining the address information in said address latch for said predetermined period of time.

8. The circuit of claim 7 further including a third input to receive a row address strobe, said circuit being responsive to said row address strobe to reset said internal write enable signal.

9. The circuit of claim 8 further including a fourth input to receive a column address strobe, wherein said internal write enable signal is generated in response to said external write enable signal, said row address strobe, and said column address strobe.

10. The circuit of claim 7 wherein said circuit further includes a timing circuit responsive to said row address strobe signal to establish said predetermined period of time.

11. The circuit of claim 7 wherein said timing circuit includes a capacitor and wherein said predetermined period of time is determined by a discharge of said capacitor.

12. A circuit for extending a valid write time in a DRAM configured as a static column mode device so that the valid write time is longer than an active state of an external write enable signal applied to the DRAM, the circuit cooperating with an address latch for latching address information and comprising:

a first circuit coupled to receive said external write enable signal, said first circuit generating an internal write enable signal within a DRAM;
said first circuit including a first input for receiving said external write enable signal, a second input for receiving a column address strobe, a third input for receiving a row address strobe, and a first output for providing said internal write enable signal;
wherein after activating the internal write enable signal, said first circuit inhibits said external write enable signal and said column address strobe from deactivating the internal write enable signal for a predetermined period of time, thereby to maintain said internal write enable signal in an active state despite a termination of an active state of the external write enable signal or the column address strobe;
a second circuit coupled to said first circuit, having a fourth input for receiving an active write signal, and generating an address delay signal, said address delay signal being coupled to an address latch of said DRAM for maintaining the address information in said address latch during said predetermined period;
said second circuit further including a fifth input for receiving said row address strobe, said row address strobe acting to terminate said address delay signal, and a timing circuit including a capacitor to determine said predetermined period of time.

13. A method for extending a write time in a DRAM configured in a static column mode so that the valid write time is longer than a active state of an external write enable signal applied to the DRAM, comprising the steps of:
receiving write control signals;
generating an internal write enable signal that changes to an active state based on timings of the write control signals;
in the static column mode, maintaining said internal write enable signal in the active state for a predetermined period despite a state change during the predetermined period in one of the write control signals on which the changing to an active state of the internal write signal was based; and
maintaining an address in an address latch within said DRAM for said predetermined period.

14. The method of claim 13 wherein said step of receiving write control signals includes receiving an external write enable signal, a row address strobe, and a column address strobe.

15. The method of claim 13 wherein said step of generating said internal write enable signal includes processing said write control signals.

16. The method of claim 13 wherein said step of maintaining said internal write enable signal in the active state for a predetermined period includes decoupling said external write enable signal and a column address signal and latching said internal write enable signal for a predetermined period.

17. The method of claim 16 wherein said step of maintaining said internal write enable signal in the active state further includes generating a first delay signal, said first delay signal determining said predetermined period.

18. The method of claim 17 wherein said predetermined period is established by a discharge of a capacitor.

19. The method of claim 13 wherein said step of maintaining said address within a DRAM includes generating a delay signal and applying said delay signal to said address latch in said DRAM.

20. A method for extending a valid write time in a DRAM configured in a static column mode so that the valid write time is longer than an active state of a first control signal used in generating an internal write enable signal of the DRAM, comprising the steps of:

generating an internal write enable signal having active and inactive states, including changing from the inactive state to the active state of the internal write enable signal based on operating on one or more control signals received by the DRAM including said first control signal;

when operating the DRAM in the static column mode, changing the internal write enable signal from the active state to the inactive state at a time that is substantially independent of timing of said first control signal, wherein the step of operating the DRAM in the static column mode further includes:

operating on the one or more control signals along a circuit path to generate the active state of the internal write enable signal; and after the internal write enable signal enters the active state, inhibiting the circuit path so that a state change in the one or more control signals does not directly cause a transition of the internal write enable signal from the active state to the inactive state.

21. The method of claim 21 wherein the step of operating the DRAM in the static column mode further includes generating a hold signal and timing an active to inactive state transition of the internal write enable signal based on the hold signal.

22. A method for extending a valid write time in a DRAM configured in a static column mode so that the valid write time is longer than an active state of a first control signal used in generating an internal write enable signal of the DRAM, comprising the steps of:

generating an internal write enable signal having active and inactive states, including changing from the inactive state to the active state of the internal write enable signal based on operating on one or more control signals received by the DRAM including said first control signal;

when operating the DRAM in the static column mode, changing the internal write enable signal from the active state to the inactive state at a time that is substantially independent of timing of said first control signal; and controlling an address latch to preserve address information for a predetermined time.

23. A method for extending a valid write time in a DRAM configured in a static column mode so that the valid write time is longer than an active state of a first control signal used in generating an internal write enable signal of the DRAM, comprising the steps of:

generating an internal write enable signal having active and inactive states, including changing from the inactive state to the active state of the internal write enable signal based on operating on one or more control signals received by the DRAM including said first control signal;

determining whether the DRAM is being operated in a fast page mode or a static column mode, and if operating in the fast page mode, then changing the states of the internal write enable signal based on timings of said one or more of the control signals, but if operating in the static column mode, then changing the internal write enable signal from the active state to the inactive state at a time that is substantially independent of timing of said first control signal, wherein the time of active to inactive transition of the internal write enable signal is determined by operating a timing circuit.

* * * * *

UNITED STATES PATENT AND TRADEMARK OFFICE
CERTIFICATE OF CORRECTION

PATENT NO. : 5,379,261
DATED : January 3, 1995
INVENTOR(S) : Oscar Jones, Jr.

It is certified that error appears in the above-indentified patent and that said Letters Patent is hereby corrected as shown below:

Col. 13, line 33, Claim 21, change "21" to --20--

Signed and Sealed this

Eighth Day of August, 1995

Attest:

BRUCE LEHMAN

Attesting Officer

Commissioner of Patents and Trademarks